United States Patent
Chang et al.

(10) Patent No.: US 9,013,908 B2
(45) Date of Patent: Apr. 21, 2015

(54) CONTROL SCHEME FOR 3D MEMORY IC

(75) Inventors: Meng-Fan Chang, Taichung (TW);
Wei-Cheng Wu, Hsinchu (TW);
Tsung-Hsien Huang, Hsinchu (TW);
Chien-Yuan Chen, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 140 days.

(21) Appl. No.: 13/524,980

(22) Filed: Jun. 15, 2012

(65) Prior Publication Data
US 2013/0148402 A1 Jun. 13, 2013

(30) Foreign Application Priority Data
Dec. 13, 2011 (TW) .............................. 100145937 A

(51) Int. Cl.
*G11C 29/00* (2006.01)
*G11C 29/02* (2006.01)
*G11C 8/08* (2006.01)
*G11C 11/417* (2006.01)
*G11C 29/26* (2006.01)
*G11C 29/04* (2006.01)
*G11C 29/12* (2006.01)

(52) U.S. Cl.
CPC .............. *G11C 29/023* (2013.01); *G11C 8/08* (2013.01); *G11C 11/417* (2013.01); *G11C 29/028* (2013.01); *G11C 29/04* (2013.01); *G11C 29/26* (2013.01); *G11C 2029/1202* (2013.01); *G11C 2029/1206* (2013.01); *G11C 2029/2602* (2013.01)

(58) Field of Classification Search
CPC ....................................................... G11C 29/00
USPC ............................................................ 365/63
See application file for complete search history.

(56) References Cited

U.S. PATENT DOCUMENTS

| | | | |
|---|---|---|---|
| 2001/0007537 A1* | 7/2001 | Agawa et al. ................ | 365/203 |
| 2002/0114202 A1* | 8/2002 | Adams et al. ................ | 365/201 |
| 2006/0120173 A1* | 6/2006 | Cho ........................ | 365/189.05 |
| 2010/0329054 A1* | 12/2010 | Azimi et al. ................ | 365/201 |
| 2011/0051528 A1* | 3/2011 | Kim ........................ | 365/189.04 |
| 2011/0084744 A1* | 4/2011 | Nishioka et al. ............. | 327/161 |
| 2011/0292708 A1* | 12/2011 | Kang et al. .................. | 365/63 |
| 2012/0134194 A1* | 5/2012 | Kim et al. .................... | 365/63 |

OTHER PUBLICATIONS

Meng-Fan Chang, et al., A Larger Stacked Layer Number Scalable TSV-based 3D-SRAM for High-Performance Universal-Memory-Capacity 3D-IC Platforms, VLSI Circuits, Jun. 15-17, 2011, pp. 74-75.

* cited by examiner

*Primary Examiner* — Huan Hoang
*Assistant Examiner* — Min Huang
(74) *Attorney, Agent, or Firm* — Muncy, Geissler, Olds & Lowe, P.C.

(57) ABSTRACT

The present invention discloses a control scheme for 3D memory IC that includes a master chip and at least one slave chip. The master chip includes a main memory core, a first local timer, an I/O buffer, a first pad and a second pad. The at least one slave chip is stacked with the master chip. Each of the slave chip includes a slave memory core, a second local timer and a third pad. A first TSV is coupled to the first pad and the third pad. A logic control circuit layer includes a logic control circuit and a fourth pad, and the logic control circuit is coupled to the fourth pad. A second TSV is coupled to the second pad and the fourth pad.

16 Claims, 18 Drawing Sheets

CONTROL SCHEME FOR 3D MEMORY IC

TECHNICAL FIELD

The present invention generally relates to a 3D stacked chip device, and especially relates to a control scheme and a circuit mechanism capable of leakage current reduction for 3D memory IC.

BACKGROUND

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3-D stacked devices. It is a technology where vertical interconnects are formed through the wafer to enable communication among the stacked chips.

As shown in FIG. 1, it shows a schematic diagram of a conventional 2D circuit stacking architecture. The architecture includes a stacked multi-layer chips and a logic control circuit layer. The multi-layer (layer 1~layer N) chips are stacked by bottom-up structure, and each chip layer comprises its respective memory array, timer and contact pads. The chips between adjacent layers are electrically connected with each other via a TSV (Through Silicon Via). For example, the first chip layer contains a memory array 103, a timer 104 and contact pads 105, and the N-th chip layer includes a memory array 107, a timer 108 and contact pad 109. Between the first~(to) N-th chip layer, the contact pads 109 and the contact pads 105 are electrically connected with each other via a TSV 106, respectively. The logic control circuit layer includes a logic control circuit 100 and contact pads 101. The contact pads 101 are electrically connected to the contact pads 105b via TSV 102. The logic control circuit 100 can be electrically connected to the above-mentioned contact pads to control the chip on the first chip layer to the N-th chip layer. In the direct stacking architecture, each chip layer includes its respective timer and decoder, and each chip layer shares the same I/O bus. The functional diagram of the above-mentioned 2D circuit scheme is shown in FIG. 2. Each chip layer includes its respective memory array (110, 120) and a local sense amplifier (111, 121), a timing control circuit (117, 127) and a logic control circuit (118, 128). The timing control circuit (117, 127) includes a local timer (112, 122) and a local bias (113, 123), and the logic control circuit (118, 128) includes a command decoder (114, 124), a command latch circuit (115, 125) and an input/output (I/O) latch circuit (116, 126). In this example, self-timing control circuit is proposed to improve the circuit yield. Purpose for such circuit design is desired to track the variation of process, voltage and temperature so that the self-timing can be automatically adjusted based-on different characteristic of each chip, and thereby improving the yield effectively.

US patent publication No. 2010/0020583A1 discloses stacked memory module and system. As shown in FIG. 3, it shows a block diagram of a three dimensional memory system. The three dimensional memory module includes a master chip and the slave chips, the master chip includes a master memory core, state circuits, an internal I/O (input/output), an external I/O (input/output) and a tracking circuit, and the slave chips include respective slave memory cores, state circuits, an internal I/O (input/output), respectively. The master chip is electrically connected to the slave chip via the internal I/O. The respective state circuits indicate a respective command execution state for the master and slave cores, respectively. The respective command execution state indicates whether a respective command such as a read, write, active, or refresh command has been executed by the respective memory core. In the master-slave scheme of the proposed patent, the tracking circuit is configured in the master chip layer, and the state circuits are configured in the slave chip layer. Therefore, the operation status of the slave chip may be sent to the tracking circuit of the master chip by the state circuit, to achieve the purpose of stackable memory by the tracking circuit.

One of the related article may refer to IEEE, JOURNAL OF SOLID-STATE CIRCUITS, VOL. 45, NO. 1, JANUARY 2010, entitled: "8 Gb 3-D DDR3 DRAM Using Through-Silicon-Via Technology". In the article, a 3-D DRAM with TSVs is proposed which overcomes the limits of conventional module approaches. As shown in FIG. 4, the master-slave chip architecture includes a master chip and slave chips, wherein the master chip includes a memory core 143, read/write control circuit 147, I/O buffer 148 and contact pads 149, and each of slave chips includes a memory core (140, 141, 142) and core test logic circuit (144, 145, 146). In the proposed patent by Samsung Electronics, the read/write control circuit 147 is configured in the master chip layer, and the test circuit is configured in the slave chip, and thereby controlling the entire circuit by the master chip layer.

In data communication systems, it typically utilizes a transmitting device that operates under control of a first clock and an independent receiving device that operates under control of a second clock. In general, the transmitting device and the receiving device have a clock rate difference. This clock rate difference causes the receiver to see the incoming data at either faster or slower than expected, hereafter referred to as "timing drifting". For packet based communication systems, if the amount of the maximum possible timing drift during the packet is much smaller than a symbol period, then this clock rate difference can be ignored. U.S. Pat. No. 7,003,056 disclosed a symbol timing tracking and method, and it uses timing tracking to correct timing drifting due to the difference in frequency of a transmitter clock and a receiver clock. With the timing tracking, correlation values of three consecutive samples are calculated using the receive signal and the recovered symbols and then summed. Further, SRAMs are widely used in applications where speed is of primary importance, such as the cache memory typically placed proximate to the processor or Central Processing Unit (CPU) in a personal computer. However, the timing of its internal circuitry may critically affect the speed and efficiency of the SRAM. For example, the bit line pre-charge interval comprises an appreciable portion of the read/write cycle time, and sense amplifier usage contributes significantly to the overall power consumption of the SRAM. In early SRAM memory designs, all read/write cycle timing was based on an externally generated clock signal. Another related art disclosed in U.S. Pat. No. 6,643,204 which includes self-time circuit for reducing the write cycle time in a semiconductor memory. A "dummy" memory cell having the same timing requirements as the functional cells, and associated write logic are added to the standard circuitry of the memory device. The dummy write cell receives the same control signals used to write data to the functional cells of the memory, and is configured to issue a completion signal when a write access is concluded, causing the write cycle to be terminated. The circuit and method permits write cycle time to be reduced to the lowest practical value, independently of the read cycle time. This potentially increases the overall operating speed of the memory device.

As mentioned above, some stacked memory architectures have been proposed. However, there are still some technical difficulties and bottlenecks to be overcome, such as wire (trace) RC delay, increased leakage current and the process issues. Furthermore, the process development for 3D chip is in embryonic stage, there are some issues to be resolved, for example through silicon via (TSV) overloading resulting in poor performance, or larger area making poor efficiency. In the circuit scheme of multi-layer stacking chips, the power dissipation accumulated by the leakage current can not be underestimated. Based-on these issues to be improved, the present invention proposes a new type stacked structure and a circuit mechanism to reduce the leakage current to address and improve the above issues.

SUMMARY OF THE INVENTION

An aspect of the present invention is to provide a 3D memory IC Semi-Master Slave scheme. Utilizing the design of self-timing control, based on the timing shift (offset) caused by the variation of the process, it can achieve self-timing of each chip layer of the 3D chip layers and effectively increase the circuit yield. The master control circuit is only configured in the master layer, which can reach a ultra scalable design and effectively reduce the design complexity of the respective layers and accelerate the design process.

A control scheme for 3D memory IC comprises a master chip layer, including a master memory core, a first timer, an input/output buffer, a first contact pad and a second contact pad; at least one slave chip layer, stacked with the master chip layer, wherein each of the at least one slave chip layer includes a respective slave memory core, a second timer and a third contact pad; and a first through-silicon-via (TSV), coupled to the first contact pad and the third contact pad. The control scheme further comprises a logic control circuit layer, including a logic control circuit and a fourth contact pad, wherein the logic control circuit is coupled to the fourth contact pad; and a second through-silicon-via (TSV), coupled to the second contact pad and the fourth contact pad.

According to another aspect of the present invention, it provides a control scheme for 3D memory IC, comprising a master chip layer, including a master memory core, a logic control circuit and a first timing control circuit; and at least one slave chip layer, stacked with the master chip layer, wherein each of the at least one slave chip layer includes a respective slave memory core and a second timing control circuit; wherein the logic control circuit is capable of controlling the master memory core and the slave memory core.

The master chip layer further comprises an input/output buffer, and each of the at least one slave chip layer further comprises a core test logic circuit.

According to yet another aspect of the present invention, it provides a control scheme capable of leakage current reduction for 3D memory IC, comprising a stacked chips layers, each layer of the stacked chips layers including a memory core; a header circuit, coupled to the memory core; a footer circuit, coupled to the memory core; a leakage current tracking circuit, coupled to the header circuit; and a data retention circuit, coupled to the header circuit and the footer circuit. The control scheme of the stacked chips layers may be referred to the above-mentioned scheme. The leakage current tracking circuit or the data retention circuit is capable of clamping to a relative high potential level of a memory array.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention generally relates to a control scheme and a circuit mechanism capable of leakage current reduction for 3D memory IC which can be introduced to a 3D-SRAM. The present invention provides a Semi Master Slave (SMS) scheme and a Self-timed Differential-TSV signal transfer (STDT) scheme to 1). provide a constant-load logic-SRAM interface across various layer configurations; 2). suppress TSV-induced power and speed overheads; 3). tolerate die-to-die variation; and 4). enable pre-bonding Known Good Die (KGD) sorting to improve the speed and yield of universal-memory-capacity platforms. The present invention can be applied to a 3D TSV SRAM with superior scalability, high speed and low power consumption.

Figure 1:
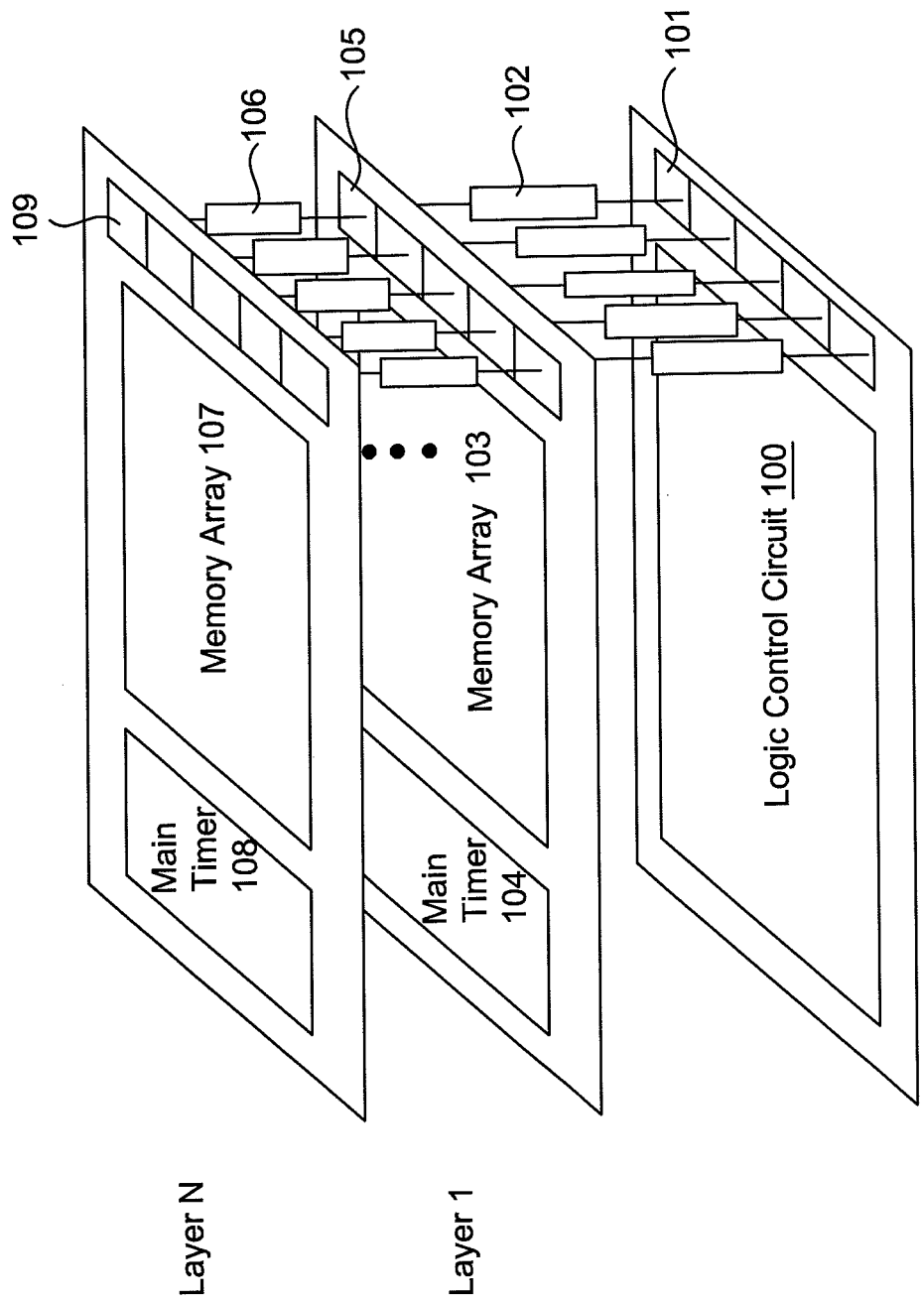
FIG. 1 illustrates a schematic diagram of a conventional 2D circuit stacking architecture.
Figure 2:
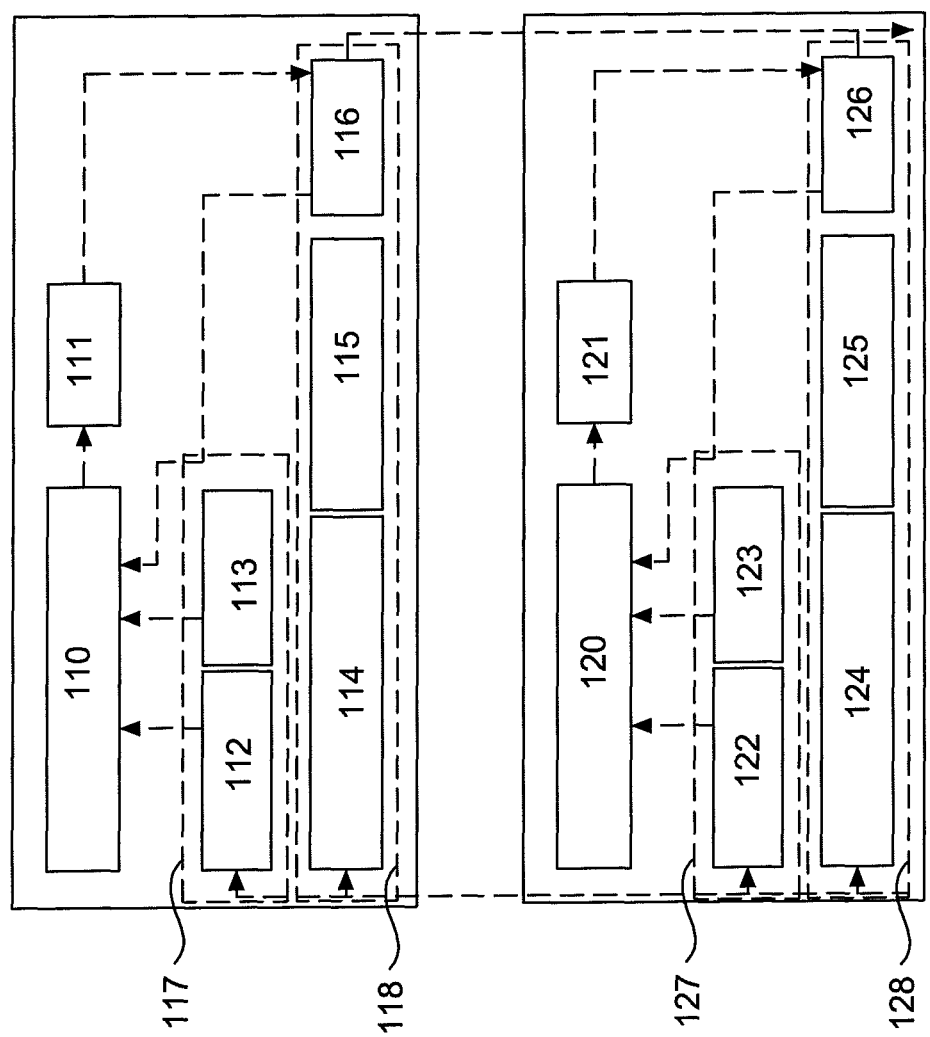
FIG. 2 illustrates a functional diagram of the above-mentioned 2D circuit stacking scheme.
Figure 3:
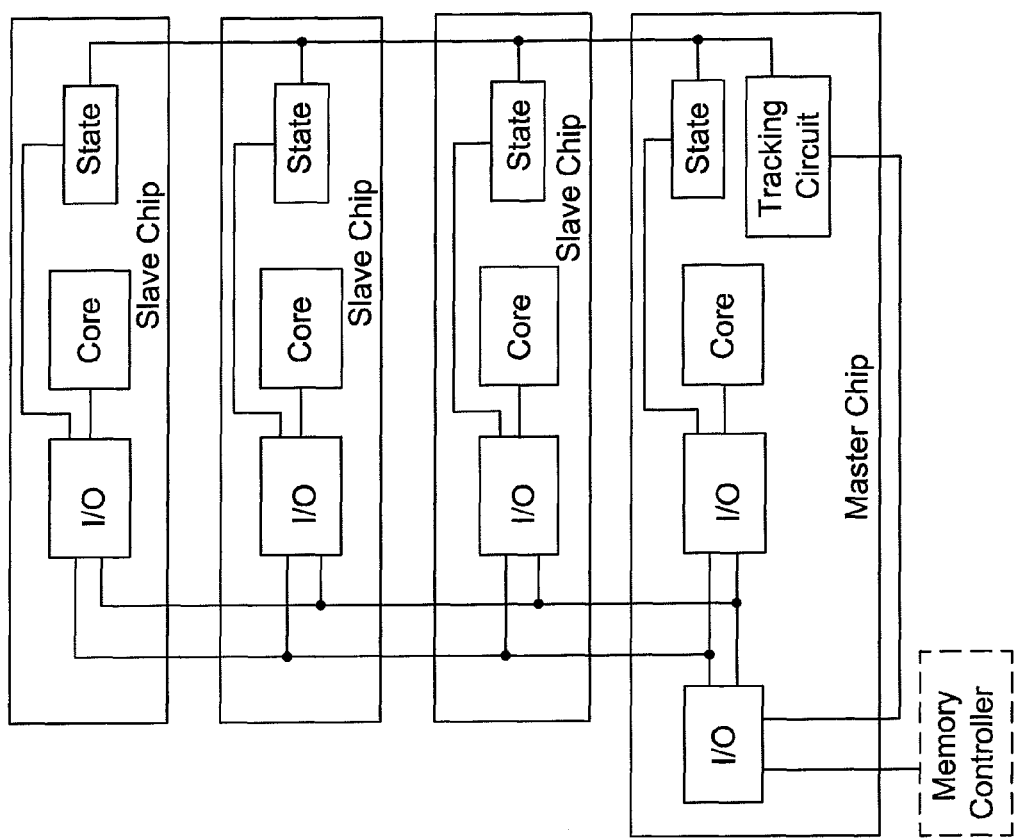
FIG. 3 illustrates a block diagram of a three dimensional memory system.
Figure 4:
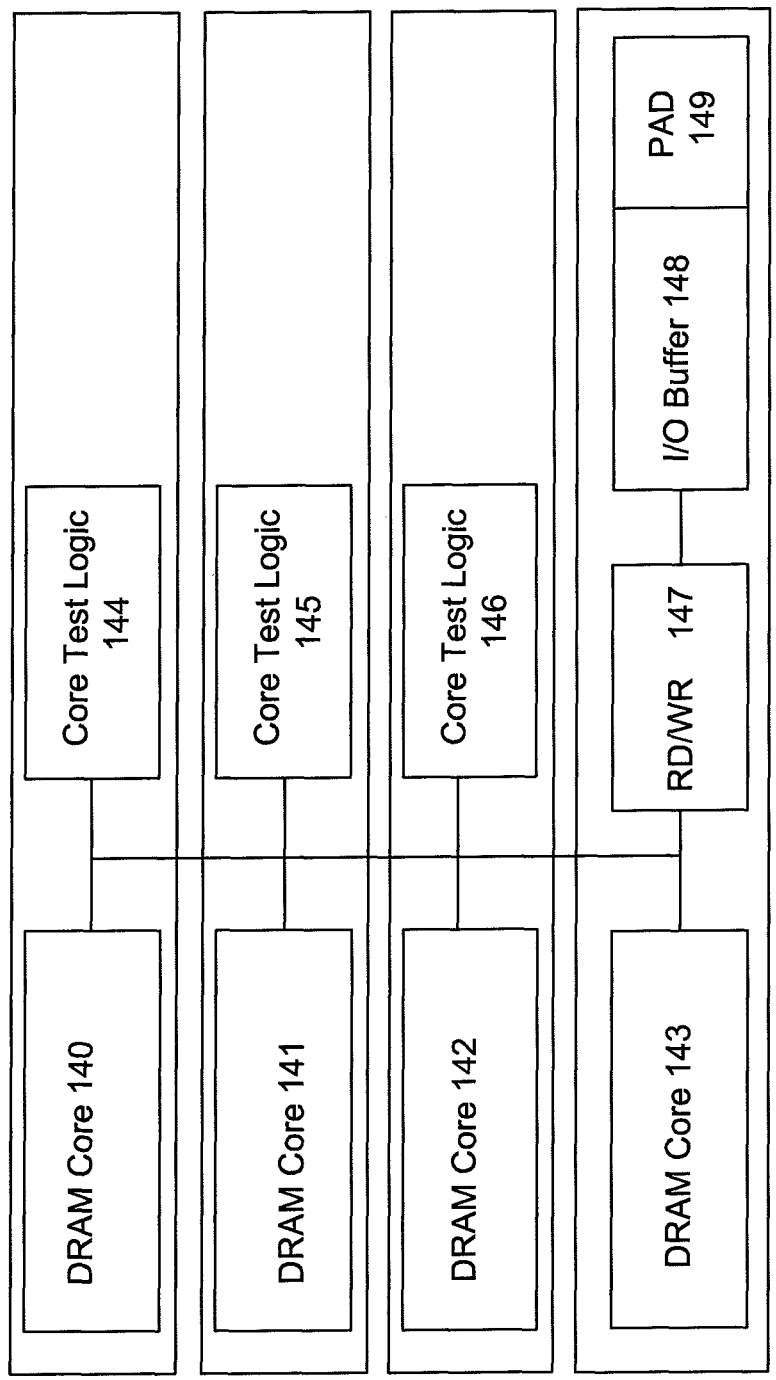
FIG. 4 illustrates a master-slave chip architecture.
Figure 5:
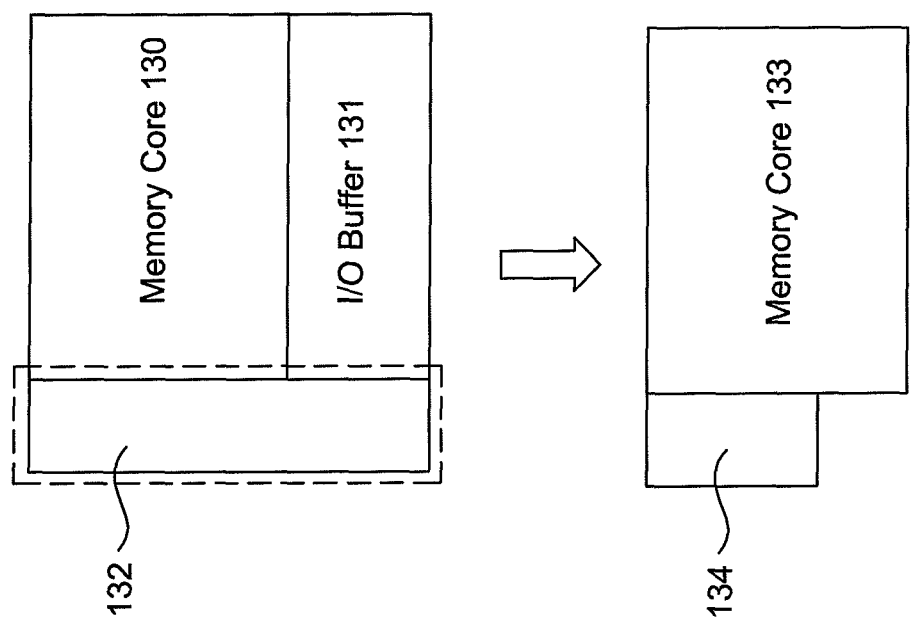
FIG. 5 illustrates a schematic diagram of a master-slave chip architecture of a three-dimensional memory chips.
Figure 6:
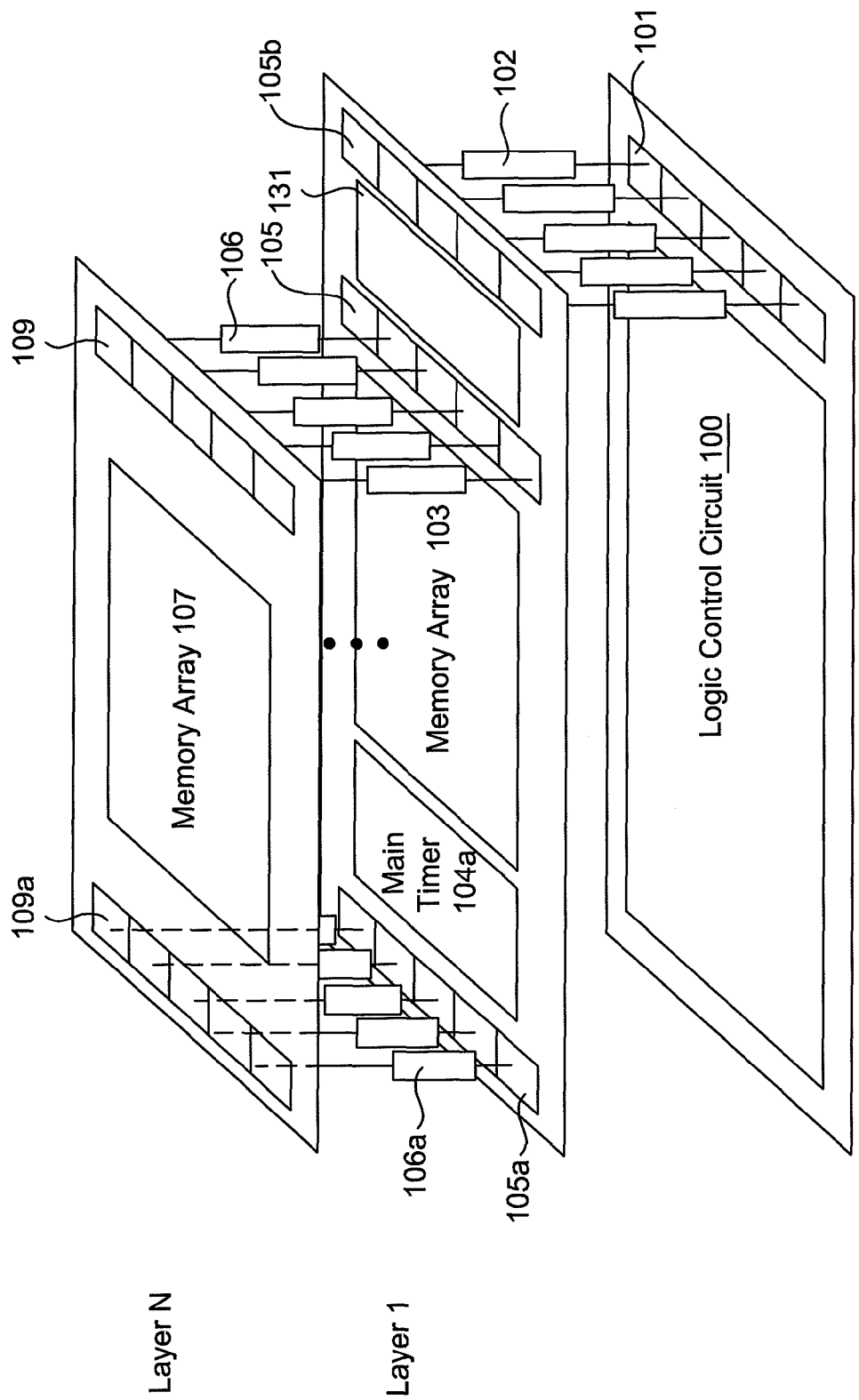
FIG. 6 illustrates a schematic diagram of the master-slave chip architecture of a three-dimensional memory chips.
Figure 7:
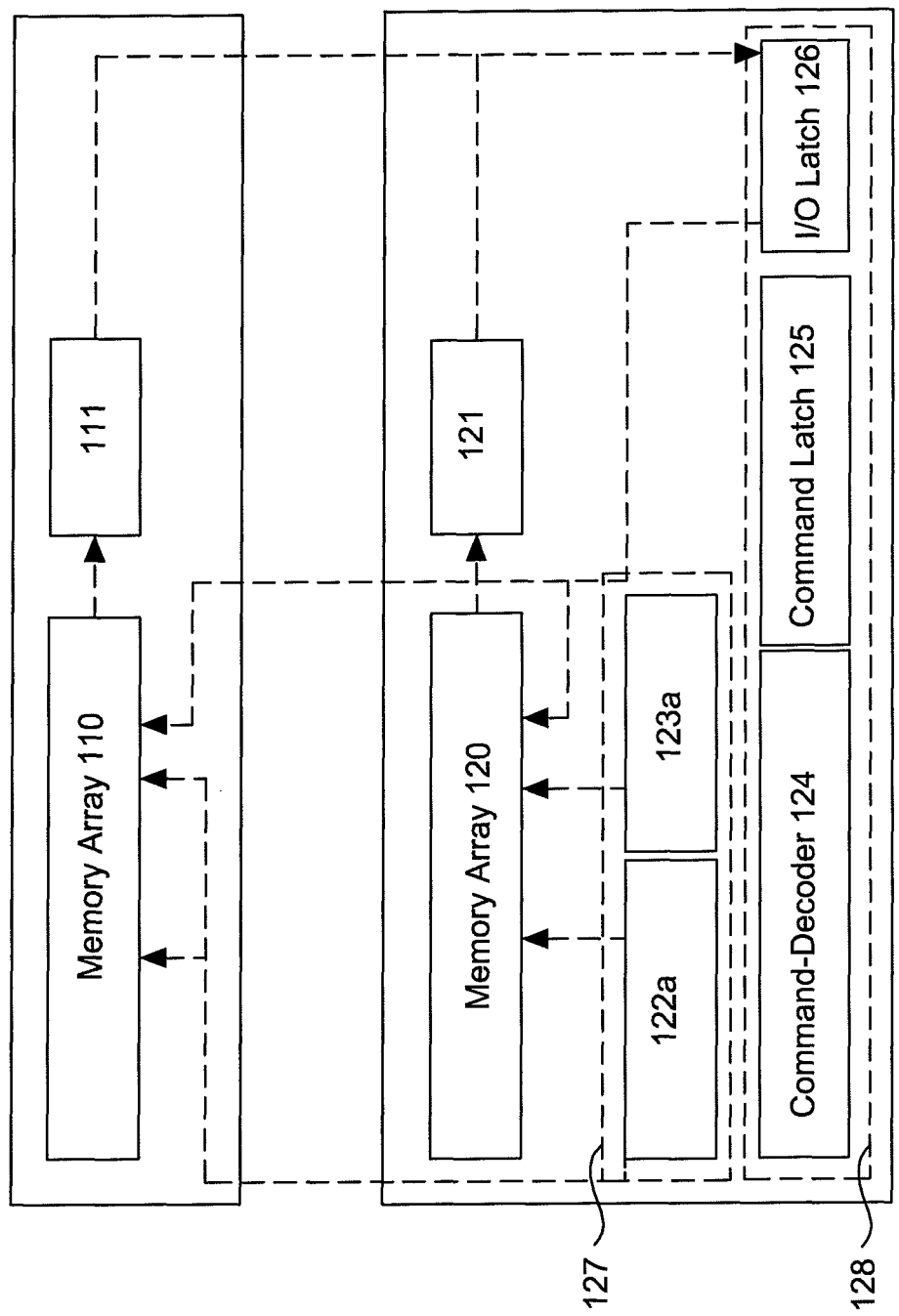
FIG. 7 illustrates a functional diagram of the master-slave chip architecture of a three-dimensional memory chips.

As shown in FIG. 5, it shows a schematic diagram of a master-slave chip architecture of a three-dimensional memory chips. The chip architecture includes a master (main) chip and a slave chip. The master chip includes a memory core 130, an I/O buffer 131 and a master (main) control circuit 132, and the slave chip includes a memory core 133 and a core test logic circuit 134. As shown in FIG. 6, it shows a schematic diagram of the above-mentioned master-slave chip architecture. The architecture includes a stacked multi-layer chips and a logic control circuit layer. The multi-layer (layer 1~layer N) chips are stacked by bottom-up structure, and each chip layer comprises its respective memory array and contact pads. The chips between adjacent layers are electrically connected with each other via a TSV (Through Silicon Via). For example, the first chip layer contains a memory array 103, a master timer 104a, the I/O buffer 131 and contact pads 105, 105 a, 105b, and the second~(to) N-th chip layer includes a memory array 107 and contact pad 109, 109a. Between the first~(to) N-th chip layer, the contact pads 109, 109a and the contact pads 105, 105a are electrically connected with each other via a TSV 106, 106a, respectively. The logic control circuit layer contains the logic control circuit 100 and the contact pads 101, and the logic control circuit 100 is coupled to the contact pads 101. The contact pads 101 are electrically connected to the contact pads 105b via TSV 102. The logic control circuit 100 can be electrically connected to the above-mentioned contact pads 101 and 105b via TSV 101, to control the chip on the first chip layer to the N-th chip layer. It should be noted that the first chip layer is the master chip layer, and the others second~N-th chip layers are the slave chip layer. Only the master chip layer includes the master (global) timer 104a and the I/O buffer 131. Therefore, in the overall architecture, the timing of each chip is controlled through the main timer 104a of the master chip layer. The master timer 104a is electrically connected to the memory array 107 through contact pads 105a, TSV 106a and the contact pads 109a, and the I/O buffers 131 is electrically connected to the memory array 103. In this architecture, the master chip layer contains a decoder, the main timer and the I/O buffers, and the slave chip layer includes its respective memory array and local sense amplifier. In one example, the functional diagram of the above-mentioned master-slave chip architecture is shown in FIG. 7. Each slave chip layer includes its respective memory array 110 and a local sense amplifier 111. The master chip layer includes a memory array 120, a local sense amplifier 121, a timing control circuit 127a and a logic control circuit 128. It is noted that the timing control circuit 127a of the master chip layer includes a global timer 122a and a global bias 123a, and the logic control circuit 128 includes a command decoder 124, a command latch circuit 125 and an input/output (I/O) latch circuit 126. In this example, it uses the master-slave chip architecture to increase the scalability of the circuit, in order to achieve the purpose of reducing cost and time of the design. However, in such an architecture, the entire control circuit is configured in the master chip layer; and the slave chip layer is merely provided with a memory unit, wherein the slave chip layer is free of a control unit. Therefore, when the process (voltage, temperature) variation between the master chip layer and the slave chip layer is inconsistent, the self-timing can not be achieved by the variation of process, and thereby the timing error occurring while substantially cause decline of yield.

As mentioned above, in advanced processes, the influence due to the process-voltage-temperature variation (PVT Variation) is gradually increased, and therefore it is very likely to cause the performance differences between the different chips. In the master-slave chip architecture, because all of the control circuits are controlled by the master chip layer, the process variation of the slave chip layer(s) is difficult to precisely control. Therefore, the present invention adapts a three-dimensional (3D) TSV process combined with the new master-slave chip architecture, to achieve the chip design with ultra scalable test modes.

Figure 8:
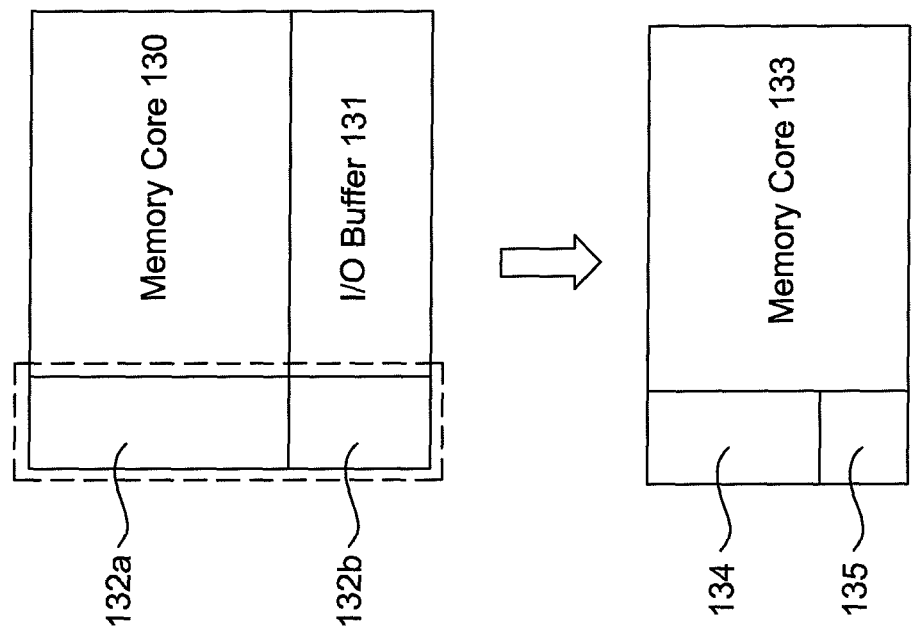
FIG. 8 illustrates a schematic diagram of a semi-master-slave chip architecture of a preferred embodiment of the present invention.

As shown in FIG. 8, it shows a schematic diagram of a brand-new master-slave chip architecture of a preferred embodiment of the present invention. In this embodiment, it shows a 3D IC Semi-Master Slave chip architecture. The chip architecture includes a master (main) chip layer and slave chip layers. The master chip layer includes a memory core 130, an I/O buffer 131 and a master (main) control circuit, and the slave chip layer includes a memory core 133, a core test logic circuit 134 and a timing control circuit 135. It should be noted that the master control circuit of the master chip layer includes a logic control circuit 132a and a timing control circuit 132b. Therefore, in this embodiment, in the overall architecture, the timing control and the logic control are separately operated, the memory array of the master chip layer and the slave chip layer is controlled by the logic control circuit 132a of the master control circuit of the master chip layer. The master chip layer and the slave chip layer retained their respective timing control circuit and bias settings. For example, the first timing control circuit of the master chip layer generates a pulse for the second timing control circuit of the slave chip layer, and other timing (self-timing) and tracking is self-generated by the second timing control circuit of the slave chip layer, and therefore enabling to self-adjust its timing. In other words, in the present invention, the first timing provides a timing pulse to the second timing, and the second timing generates its own timing.

Figure 9:
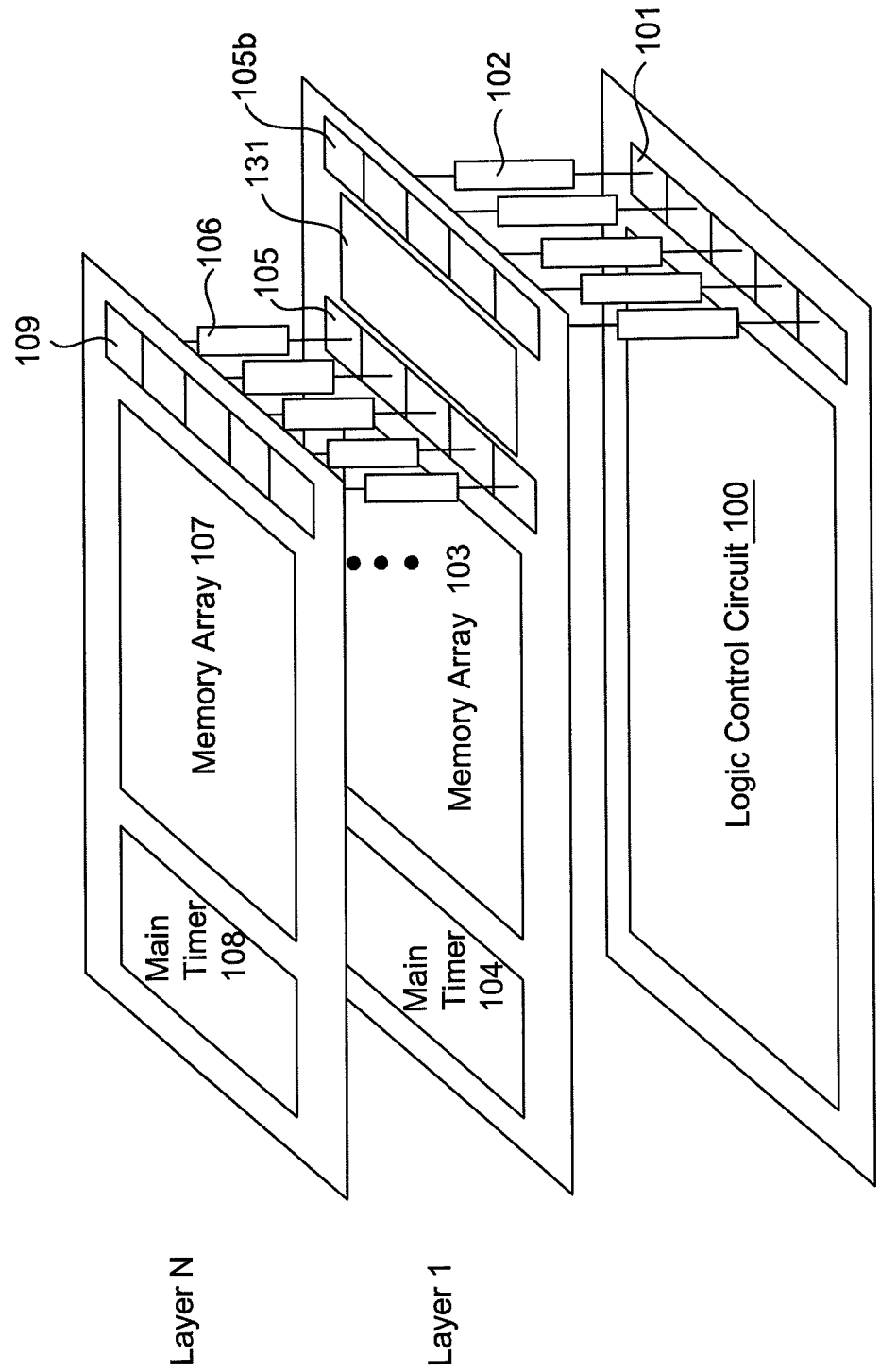
FIG. 9 illustrates a schematic diagram of a Semi-Master-Slave chip architecture of the present invention.

In one embodiment, the above-mentioned Semi-Master-Slave chip architecture is shown in FIG. 9. The architecture includes a stacked multi-layer chips and a logic control circuit layer. The multi-layer (layer 1~layer N) chips are stacked by bottom-up structure, and each chip layer comprises its respective memory array and contact pads. The chips between adjacent layers are electrically connected with each other via a TSV. For example, the first chip layer contains a memory array 103, a local timer 104, a I/O buffer 131 and contact pads 105, 105b, and the second~N-th chip layer includes a memory array 107, a local timer 108 and contact pad 109. Between the first~N-th chip layer, the contact pads 109 and the contact pads 105 are electrically connected with each other via a TSV 106, respectively. The logic control circuit layer includes the logic control circuit 100 and the contact pads 101, and the logic control circuit 100 is coupled to the contact pads 101. The contact pads 101 are electrically connected to the contact pads 105b via TSV 102. The logic control circuit 100 can be electrically connected to the above-mentioned contact pads 105b via TSV 102, to control the memory core on the first chip layer to the N-th chip layer. It should be noted that the first chip layer is the master chip layer, and the others second~N-th chip layers are the slave chip layer. Only the master chip layer includes the I/O buffer 131. The master chip layer and the slave chip layer have their respective local timer. Therefore, in the whole architecture, the signal is transmitted by self-timed differential-TSV (STDT). The local timers 104, 108 are electrically connected to the memory array 103, 107, respectively, and the I/O buffer 131 is electrically connected to the memory array 103. In this architecture, the master chip layer includes a memory array, a local timer and a local sense amplifier.

Figure 10:
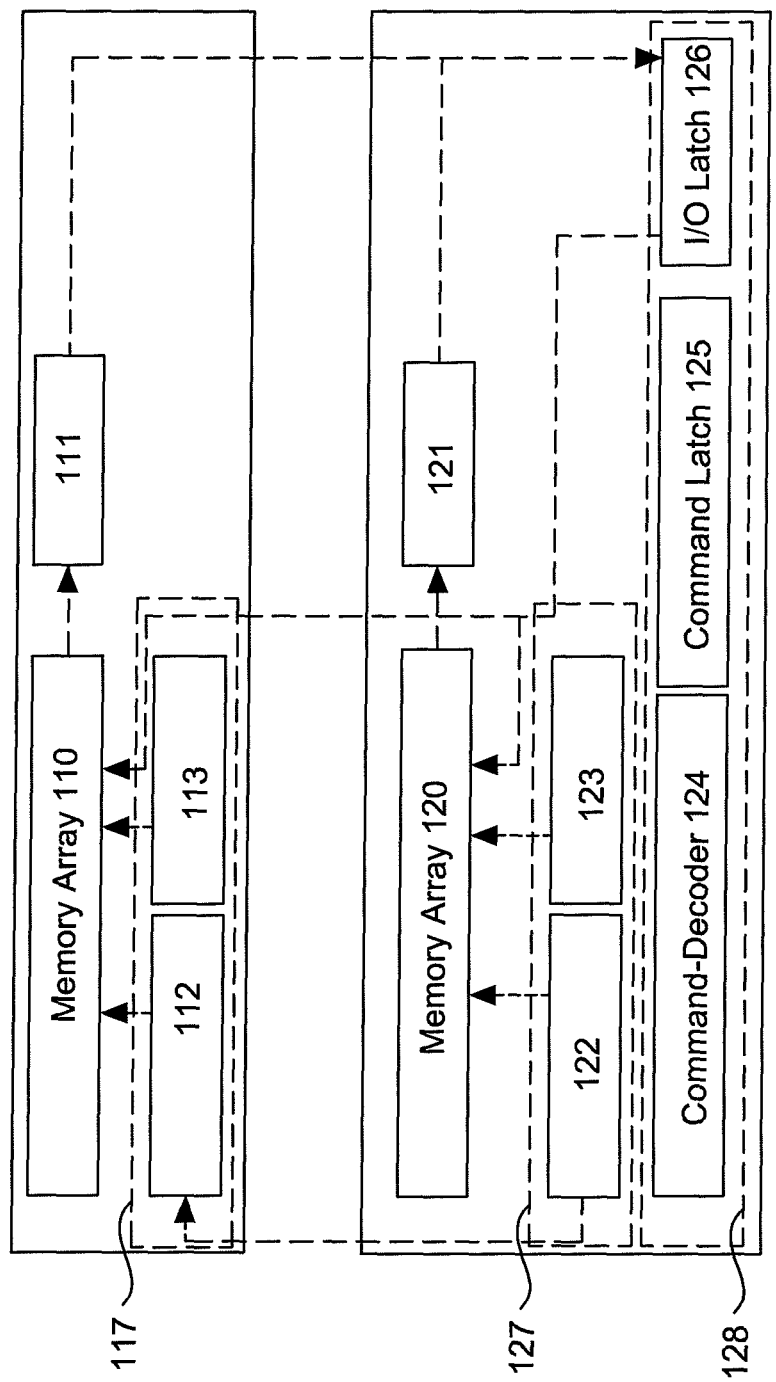
FIG. 10 illustrates a functional diagram of the semi-master-slave chip architecture of the present invention.

Timing control circuit of the present invention is designed to be the master chip layer providing the initial timing, and self-tracking variation of process, voltage and temperature, to adjust the timing control. In one embodiment, the functional diagram of the above-mentioned semi-master-slave chip architecture is shown in FIG. 10. Each slave chip layer includes its respective memory array 110, a local sense amplifier 111 and a timing control circuit 117. The timing control circuit 117 includes a local timer 112 and a local bias 113. The memory array 110 is coupled to the local sense amplifier 111, the local timer 112 and the local bias 113. The master chip layer includes a memory array 120, a local sense amplifier 121, a timing control circuit 127 and a logic control circuit 128. It should be noted that the timing control circuit 127 of the master chip layer includes a local timer 122 and a local bias 123, and the logic control circuit 128 includes a command decoder 124, a command latch circuit 125 and an input/output (I/O) latch circuit 126. The memory array 120 is coupled to the local sense amplifier 121, the local timer 122 and the local bias 123. The input/output (I/O) latch circuit 126 is coupled to the memory array 120, the memory array 110 and the local sense amplifier 111 to apply calibration results after the latch completed. In this embodiment, it uses the semi-master-slave chip architecture to increase the scalability of the circuit, in order to achieve the purpose of reducing cost and time of the design. From the above examples, it can be realized that the timing control free of self-adjustment is the main cause of the yield loss. In the above master-slave architecture, the control unit will be removed from the slave chip layer, and it causes that the self-timing can not be achieved by means of the variation of the process of the respective layers. Therefore, the present invention will separate the two parts of the control unit, and the self-timing control circuit is maintained in the slave chip layer, so that each layer (the master chip layer and the slave chip layer) can adjust the timing control according to their respective variation of the process, voltage and temperature (PVT variation) to improve the overall yield.

Figure 11:
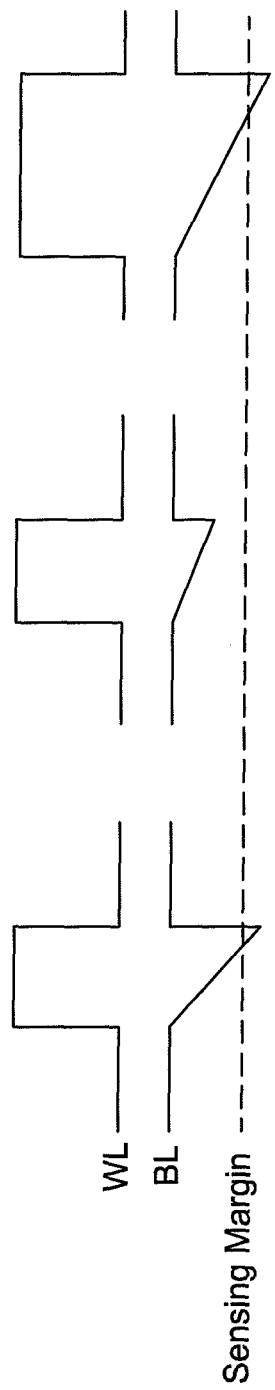
FIG. 11 illustrates a schematic diagram of a waveform.

As shown in FIG. 11, it shows a schematic diagram of a waveform. The left part shows the waveform of the semi-master-slave chip architecture, wherein sensing condition of the master chip layer and the slave chip layer are also TT Corner; the central part shows the waveform of the master-slave chip architecture, wherein sensing condition of the master chip layer is TT Corner, and sensing condition of the slave chip layer is SS Corner; the right part also shows the waveform of the semi-master-slave chip architecture, wherein sensing condition of the master is TT Corner, and sensing condition of the slave chip layer is SS Corner. Based-on the FIG. 11, in the semi-master-slave chip architecture, when the sensing condition of the master chip layer and the slave chip layer are TT Corner, or the sensing condition of the master chip layer is TT Corner and the sensing condition of the slave chip layer is SS Corner, signal swing for bit line of SRAM can be normally to reach a sensing margin. However, in the master-slave chip architecture, when the sensing condition of the master chip layer is TT Corner and the sensing condition of the slave chip layer is SS Corner, due to the slower speed of bit line and TT Corner speed of word line of SRAM of the slave chip layer, therefore the chip sensing of the master chip layer and the slave chip layer fail. In other words, in the semi-master-slave chip architecture, the local timing control circuit can make an appropriate response or adjustment based on variation of the process, voltage and temperature. For example, the width of word line pulse is determined based on the speed of SRAM. Therefore, the sensing can be achieved by automatically adjusting the width of word line pulse.

The circuit scheme and mechanism capable of leakage current reduction under the semi-master-slave chip architecture are described as follows. A circuit system is used to reduce leakage current, wherein the master layer provides a signal to reduce the operating voltage of the slave layer, and the slave layer controls the tolerance value of the minimum voltage to prevent the failure of data. The circuit needs to be designed to be self-tracking variation of temperature to adjust the voltage. Under the shrinkage tendency of the semiconductor device's design rule, the ratio of power dissipation of a leakage current of the three-dimensional chip is greatly increasing. Therefore, the present invention provides a leakage tracking scheme (LTS) and a data retention scheme (DRS) for temperature sensing, and thus controlling a relative high potential (VDD) and a relative low potential (VSS) of the memory array to achieve the purpose of reducing the leakage current and power dissipation.

In general, the power dissipation of the three-dimensional chip is equal to active power plus leakage power. The power dissipation of the three-dimensional chip is described as follows, $$\alpha \times f \times C \times V_{DD}^2 + V_{DD} \times I_{leakage\ current}$$

Figure 12:
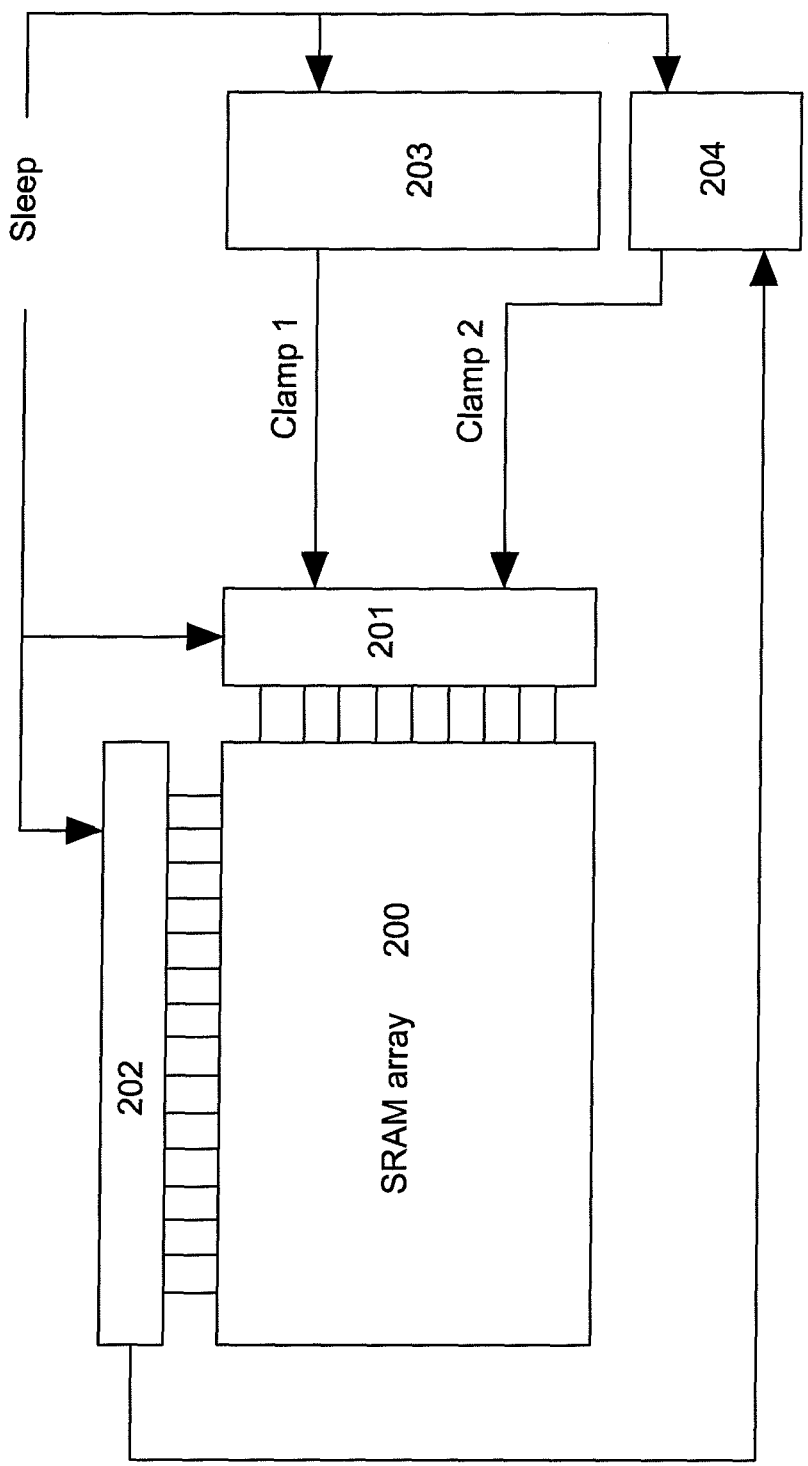
FIG. 12 illustrates a circuit scheme for leakage current reduction of the three-dimensional memory chips.
Figure 16:
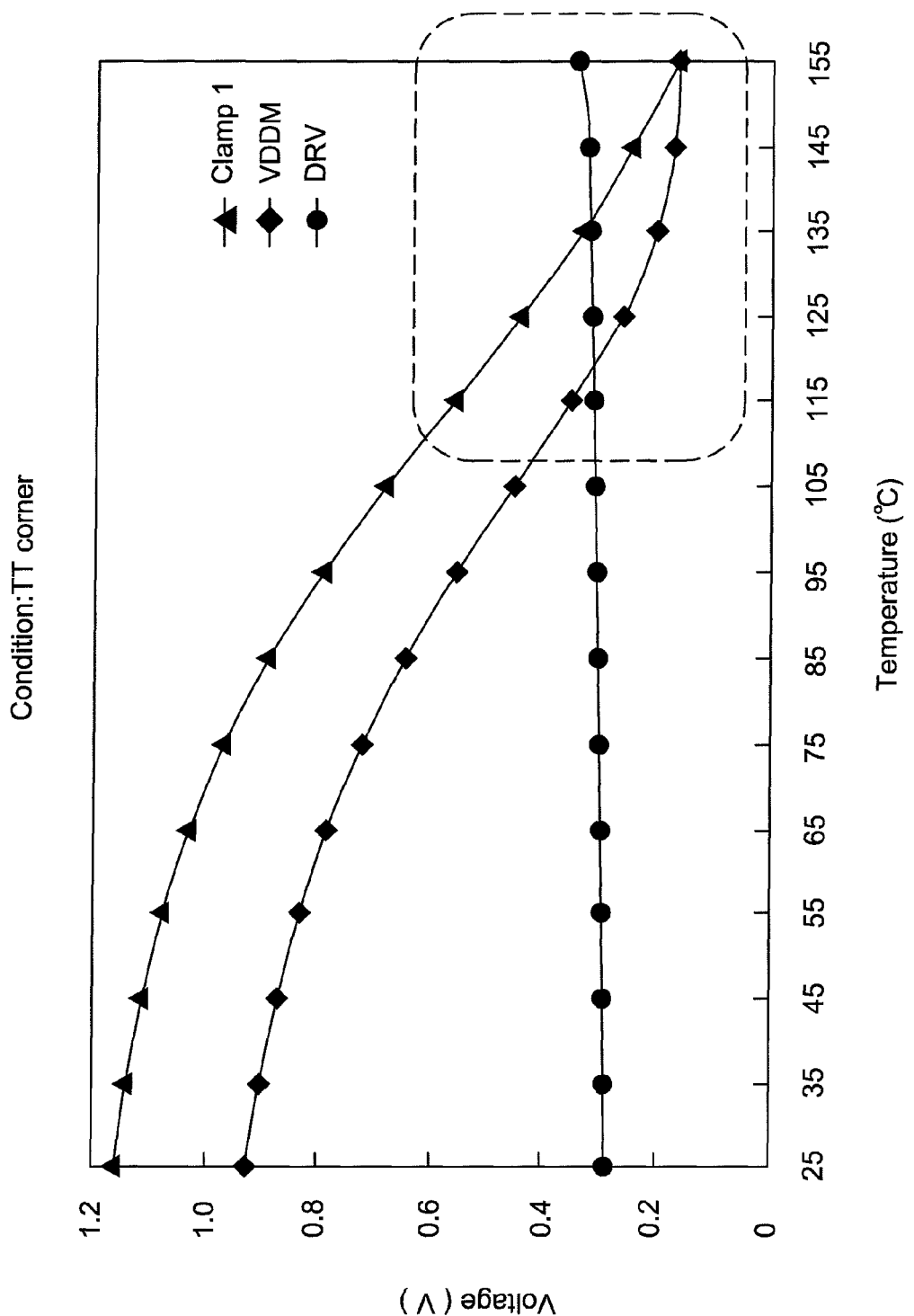
FIG. 16 illustrates a graph of relation between the temperature and voltage of the clamp 1, VDDM and DRV (Data Retention Voltage)
Figure 17:
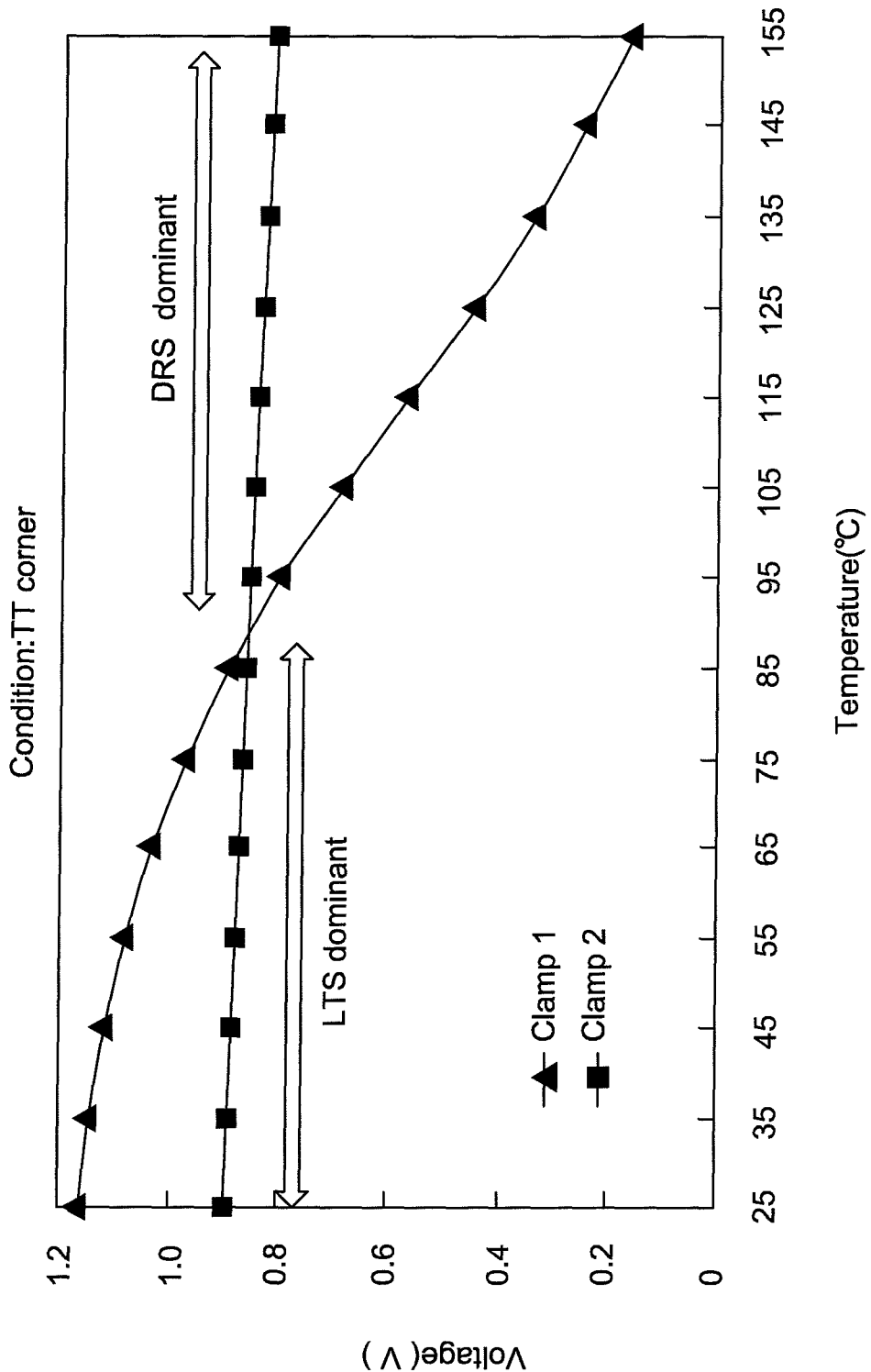
FIG. 17 illustrates a graph of relation between the temperature and voltage of the clamp 1 and clamp 2.

As shown in FIG. 12, it shows a circuit scheme for leakage current reduction of the three-dimensional chips. This circuit scheme can be applied to the master chip layer and/or the slave chip layer of the semi-master-slave chip layer. The circuit scheme includes a memory array 200, a leakage current tracking circuit 203 and a data retention circuit 204. The memory array 200 is coupled to a header circuit 201 and a footer circuit 202. The leakage current tracking circuit 203 and the data retention circuit 204 are coupled to the header circuit 201, and the data retention circuit 204 is coupled to the footer circuit 202. The memory array 200 is for example a SRAM memory array 200. When the leakage current tracking circuit 203, the data retention circuit 204, the header circuit 201 and footer circuit 202 start a sleep signal, the SRAM memory array 200 enters the sleep mode. Next, it performs a thermal aware test, such as utilizing a temperature sensor to perform temperature sensing. In sensing condition as TT corner, relation between temperature and voltage is shown in FIG. 14, FIG. 16, FIG. 17 and FIG. 18. In low temperature, the leakage current tracking circuit 203 is dominate for clamping to VDDM voltage of the memory array 200; in high temperature, the data retention circuit 204 is dominate for clamping to VDDM voltage of the memory array 200, shown in FIG. 17. FIG. 17 shows a graph of relation between the temperature and voltage of the clamp 1 and clamp 2.

Figure 13:
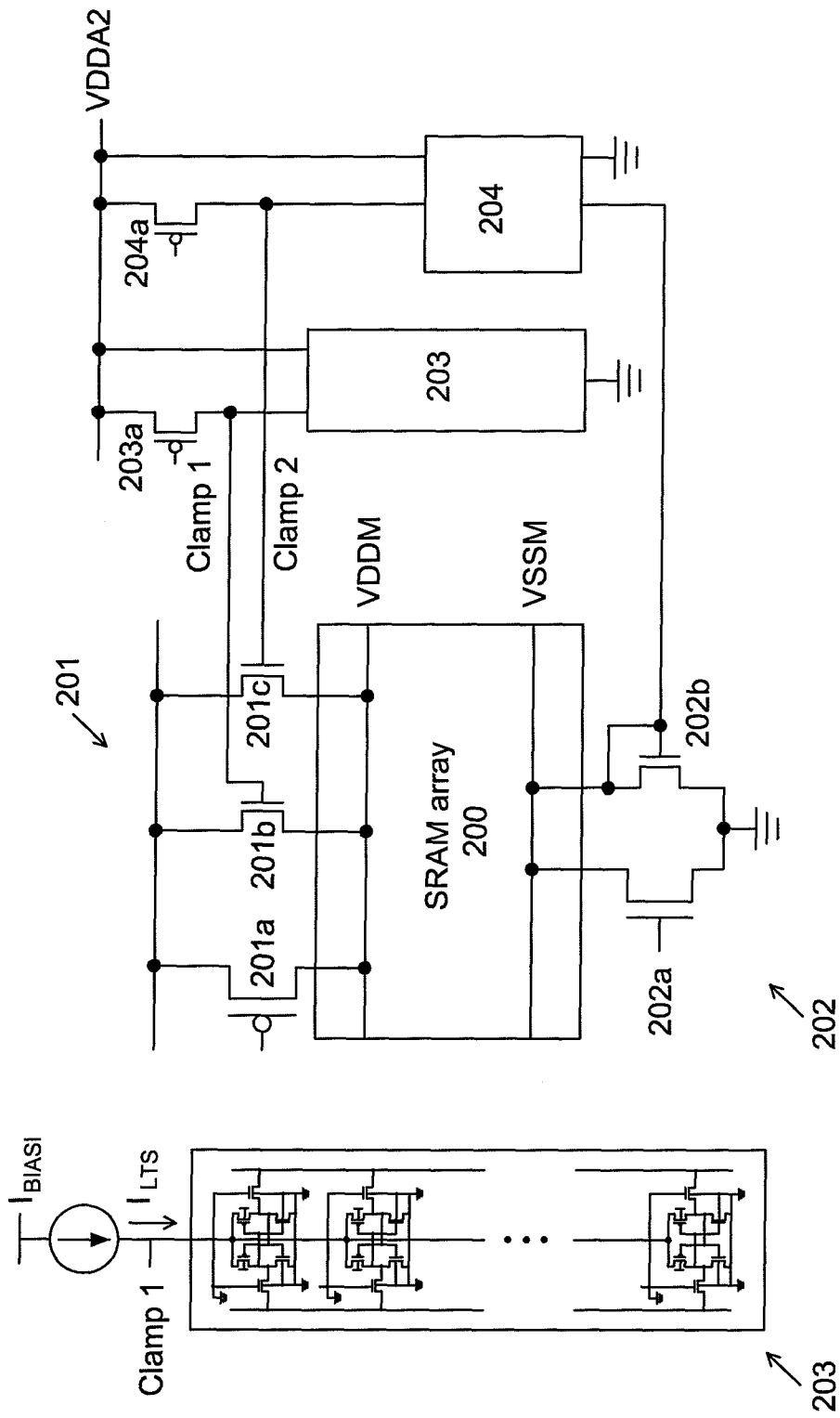
FIG. 13 illustrates a preferred embodiment of a circuit scheme for leakage current reduction of the three-dimensional semi-master-slave chip scheme.

As shown in FIG. 13, it shows a preferred embodiment of a circuit scheme for leakage current reduction of the three-dimensional semi-master-slave chip scheme. The header circuit 201 includes NMOS transistor 201a and PMOS transistor 201b, 201c, and the footer circuit 202 includes PMOS transistor 202a, 202b. Source of the NMOS transistor 201a and the PMOS transistor 201b, 201c is electrically connected to a bus. Drain of the NMOS transistor 201a and the PMOS transistor 201b, 201c is electrically connected to VDDM voltage of the memory array 200. Source of the NMOS transistor 203a and 204a is electrically connected to VDDA2 voltage. The VDDA2 voltage is electrically connected to the leakage current tracking circuit 203 and the data retention circuit 204. Drain of the NMOS transistor 203a is electrically connected to a gate of the PMOS transistor 201b and the leakage current tracking circuit 203. Drain of the NMOS transistor 204a is electrically connected to a gate of the PMOS transistor 201c and the data retention circuit 204. Drain of the PMOS transistor 202a, 202b is electrically connected to ground, and a source of the PMOS transistor 202a, 202b is electrically connected to VSSM voltage. Gate of the PMOS transistor 202b is electrically connected to the data retention circuit 204. One terminal of the leakage current tracking circuit 203 and the data retention circuit 204 is electrically connected to ground. VDDM voltage is a relative high potential level, and VSSM voltage is a relative low potential level. In one embodiment, the leakage current tracking circuit 203 utilizes a replica column circuit scheme as the leakage current monitor, shown in the left part of FIG. 13. For example, the replica column circuit scheme is configured in the master chip layer and/or the slave chip layer. The leakage current tracking circuit 203 includes a series of tracking circuit unit. Each of the tracking circuit unit includes a plurality of MOS transistors. A control circuit includes NMOS transistors 230a and 204a. The leakage current tracking circuit 203 is clamped to VDDM voltage of the memory array 200 by controlling NMOS transistor 203a. Moreover, the data retention circuit 204 is clamped to VDDM voltage of the memory array 200 by controlling NMOS transistor 204a.

In one embodiment, VDDM voltage and VSSM voltage of the slave chip layer are provided by the master chip layer; in different operating conditions, VDDM voltage and VSSM voltage of each layer of the slave chip layer will have a slight variation so that VDDM voltage and VSSM voltage of different slave chip layers will be different. As a result, utilizing the leakage current tracking circuit 203 and the data retention circuit 204 in this scheme, under different operating voltages, each of slave chip layers can self-control its VDDM voltage and VSSM voltage according to its respective situation, and thereby reducing the leakage current.

Figure 14:
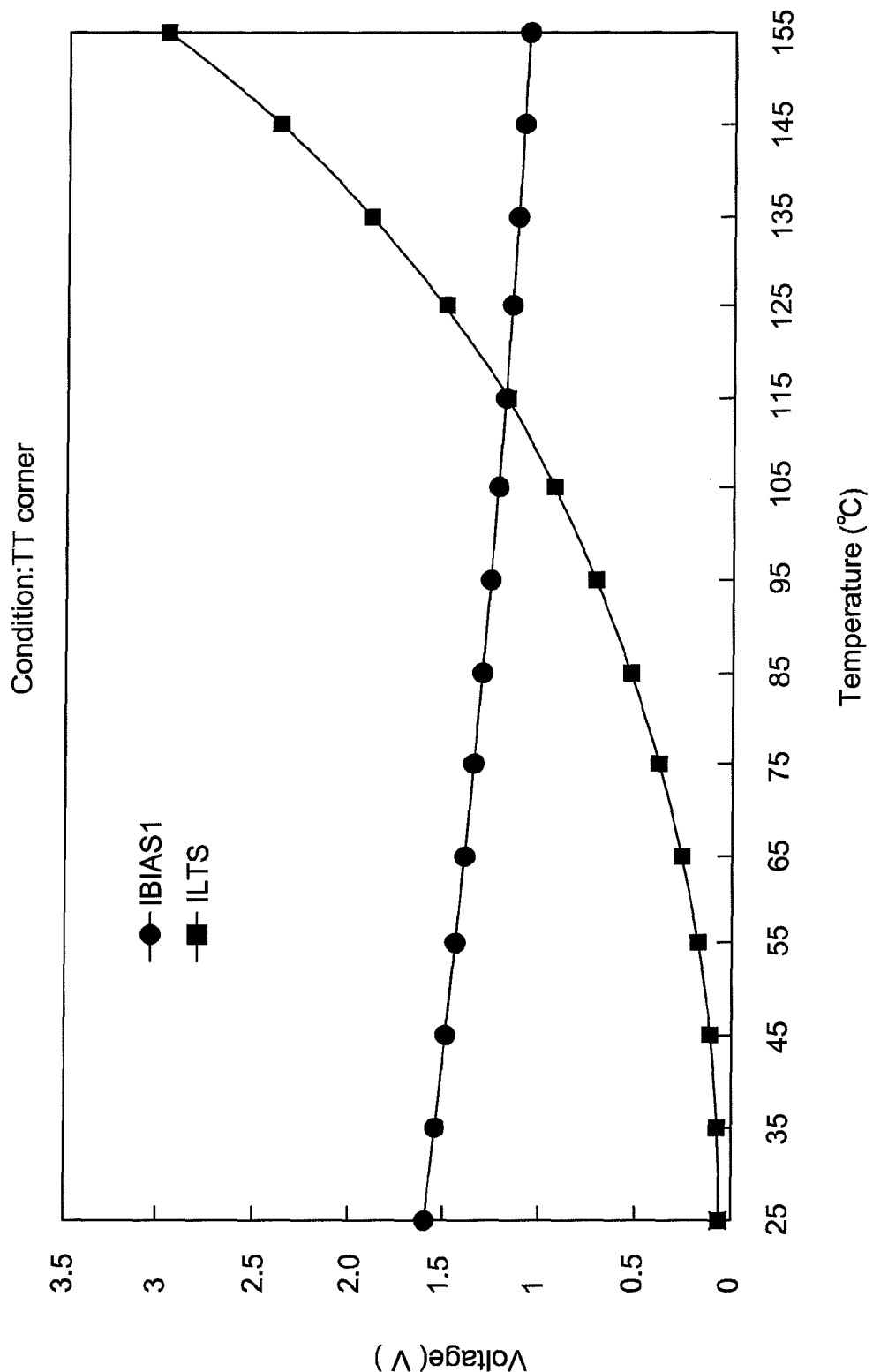
FIG. 14 illustrates a graph of relation between the temperature and voltage of $I_{LTS}$ and $I_{BIAS1}$.

The detected current $I_{LTS}$ of the tracking circuit is compared with the input bias current $I_{BIAS1}$ provided by the master chip layer. If the temperature rises, $I_{LTS}$ rises and $I_{BIAS1}$ falls, voltage of the clamp 1 (Vclamp1) will rise. The voltage of the clamp 1 is electrically connected to the header circuit 201 (MOS transistor 201b) of the memory array 200 to reduce VDDM voltage of the memory array 200, shown in FIG. 14. FIG. 14 shows a graph of relation between the temperature and voltage of $I_{LTS}$ and $I_{BIAS1}$.

Figure 15:
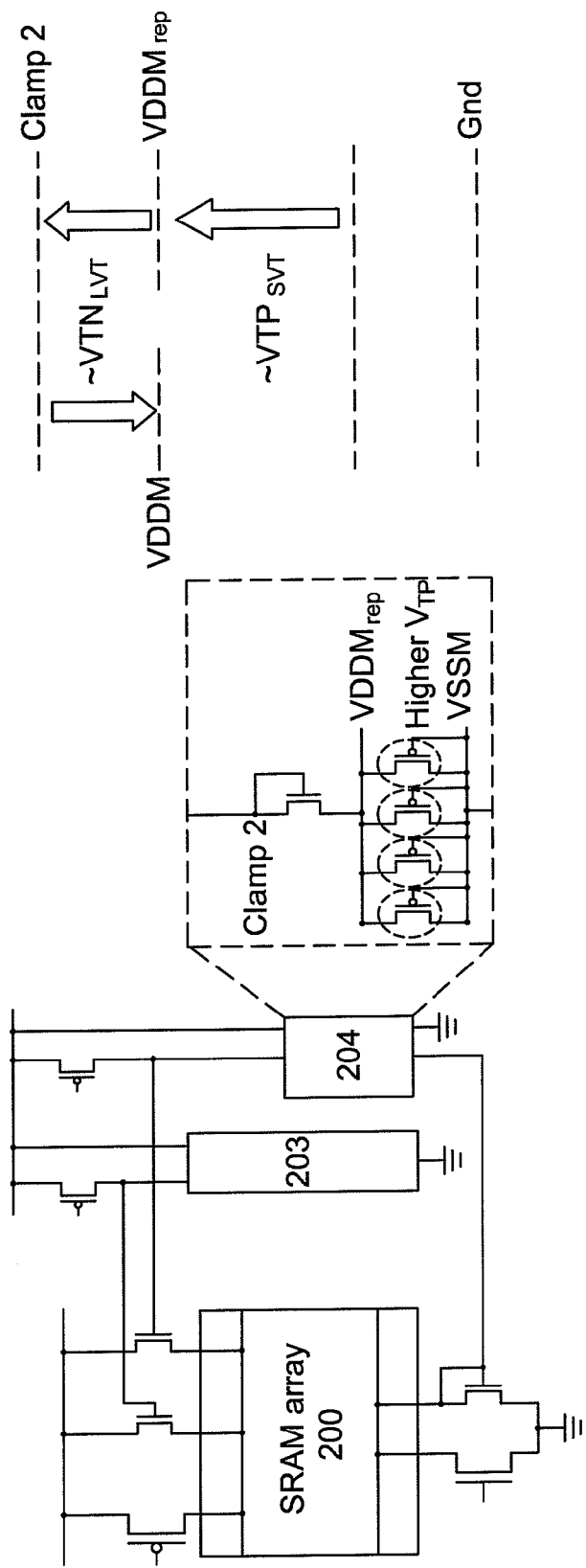
FIG. 15 illustrates a preferred embodiment of a circuit scheme for leakage current reduction of the three-dimensional semi-master-slave chip scheme.

As shown in FIG. 15, it shows a preferred embodiment of a circuit scheme for leakage current reduction of the three-dimensional semi-master-slave chip scheme. The data retention circuit 204 is a data retention voltage damper. For example, the data retention circuit 204 is configured in the master chip layer and/or the slave chip layer. The data retention circuit 204 includes replica pull up PMOS transistors coupled to a NMOS transistor, shown in the central part of FIG. 15. The replica pull up PMOS transistors includes four series PMOS transistors to raise voltage (higher $VTP_{SVT}$), such as raising 60 mV. The four series PMOS transistors are capable of reducing the local variation. Moreover, pull down NMOS transistors may be used to achieve lower data retention bias.

Utilizing the data retention circuit 204, it can guarantee that reduced VDDM voltage of the clamp 1 is not lower than data retention voltage of the data retention circuit 204 when the temperature is too high, and thus achieving a protective mechanism and effect. At high temperature, VDDM may touch data retention region, shown in the dashed box of FIG. 16. FIG. 16 shows a graph of relation between the temperature and voltage of the clamp 1, VDDM and DRV (Data Retention Voltage).

Figure 18:
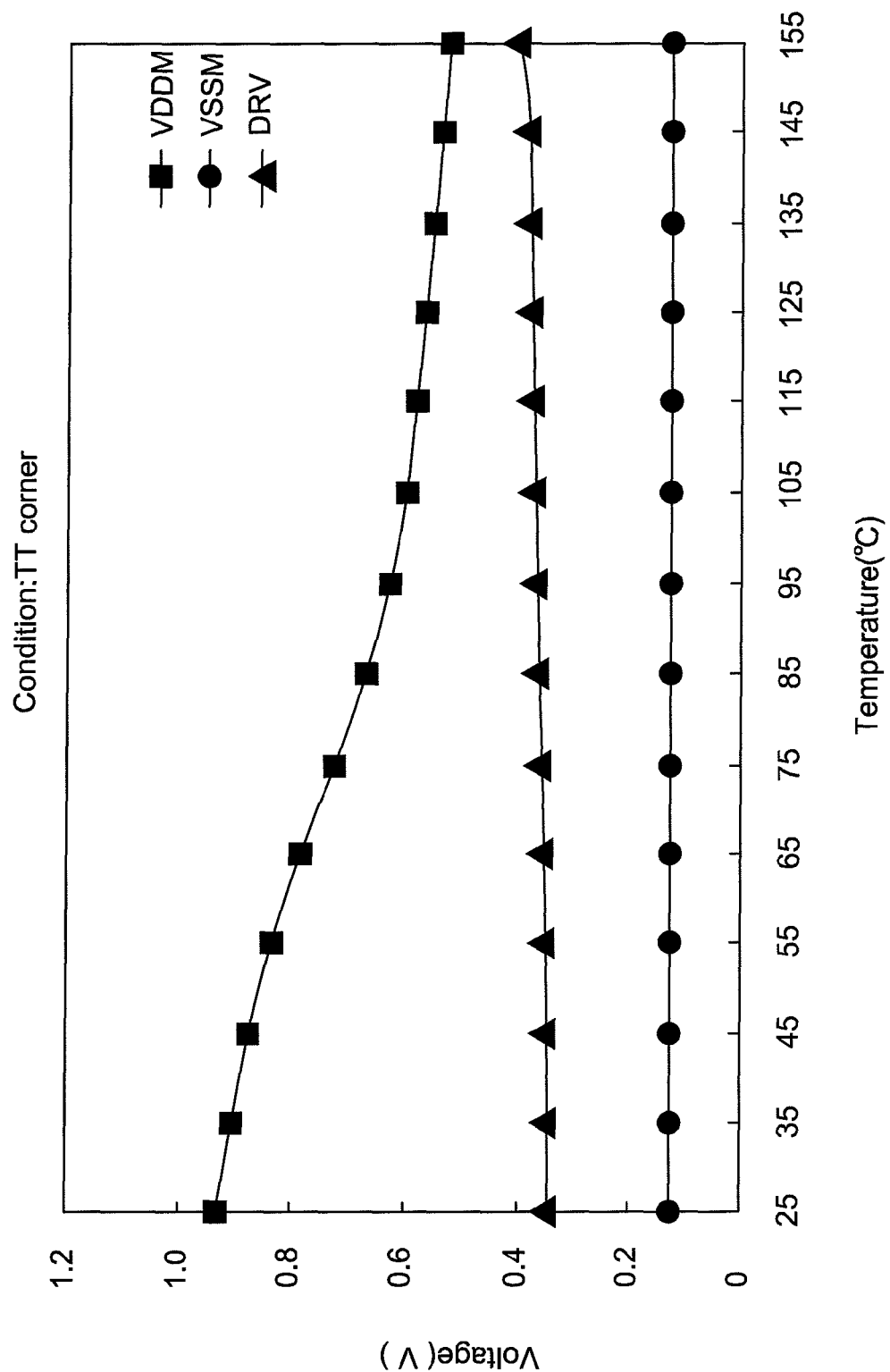
FIG. 18 illustrates a graph of relation between the temperature and voltage of the VDDM, VSSM and DRV.

Moreover, FIG. 18 shows a graph of relation between the temperature and voltage of the VDDM, VSSM and DRV. In one embodiment, under the circuit scheme of three-dimensional chip capable of leakage current reduction of the present invention, in addition to the selected layer (the master chip layer or the slave chip layer), the others chip layers can be maintained standby, while can effectively reduce the power dissipation as the standby. Furthermore, the temperature of each layer is not the same so that this mechanism can effectively control cell bias of the memory array of each chip layer, and can track variations of the process, voltage and temperature of each chip layer.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A control scheme for 3D memory IC, comprising:
    a master chip layer; including a master memory core, a first timer, an input/output buffer, a first contact pad and a second contact pad;
    at least one slave chip layer, stacked with said master chip layer, wherein each of said at least one slave chip layer respectively includes a slave memory core, a second timer and a third contact pad;
    a first through-silicon-via (TSV), coupled to said first contact pad and said third contact pad;
    a logic control circuit layer, including a logic control circuit and a fourth contact pad, wherein said logic control circuit is coupled to said fourth contact pad;
    a second through-silicon-via (TSV), coupled to said second contact pad and said fourth contact pad; and
    said first timer and said second timer are local timers to separately operate timing control for each of the master chip layer and the at least one slave chip layer, for transmitting signals by self-timed differential-TSV (STDT).

2. A control scheme for 3D memory IC, comprising:
    a master chip layer, including a master memory core, a logic control circuit and a first timing control circuit; and
    at least one slave chip layer, stacked with said master chip layer, wherein each of said at least one slave chip layer respectively includes a slave memory core and a second timing control circuit;
    wherein said logic control circuit is capable of controlling said master memory core and said slave memory core;
    said master chip layer and said at least one slave chip layer retain their respective timing and bias settings; and
    said first timing control circuit generates a pulse for said second timing control circuit, and a self-timing is generated by said second timing control circuit to adjust timing of said at least one slave chip layer.

3. The control scheme of claim 2, wherein said first timer and said second timer are a first local timer and a second local timer, respectively.

4. The control scheme of claim 2, wherein said master chip layer further comprises an input/output buffer, and wherein each of said at least one slave chip layer further comprises a core test logic circuit.

5. A control scheme capable of leakage current reduction for 3D memory IC, comprising:
    stacked chips layers include a master chip layer and at least one slave chip layer, each layer of said stacked chips layers including a memory core, and said master chip layer provides VDDM voltage and VSSM voltage to each of said at least one slave chip layer;
    a header circuit, coupled to said memory core of each of said at least one slave chip layer;
    a footer circuit, coupled to said memory core of each of said at least one slave chip layer;
    a leakage current tracking circuit, coupled to said header circuit; and
    a data retention circuit, coupled to said header circuit and said footer circuit.
    wherein the leakage current tracking circuit and the data retention circuit are utilized under different operating voltages to control said VDDM voltage and said VSSM voltage according to respective situation of each of said at least one slave chip layer, and thereby reducing a leakage current.

6. The control scheme of claim 5, wherein said master chip layer provides a relative high potential level and a relative low potential level to said at least one slave chip layer.

7. The control scheme of claim 6, wherein said master chip layer includes a master memory core, a first timer, an input/output buffer, a first contact pad and a second contact pad; wherein each of said at least one slave chip layer includes a respective slave memory core, a second timer and a third contact pad; a first through-silicon-via (TSV), coupled to said first contact pad and said third contact pad; a logic control circuit layer, including a logic control circuit and a fourth contact pad, wherein said logic control circuit is coupled to said fourth contact pad; and a second through-silicon-via (TSV), coupled to said second contact pad and said fourth contact pad.

8. The control scheme of claim 6, wherein said master chip layer includes a master memory core, a logic control circuit and a first timing control circuit; and wherein each of said at least one slave chip layer includes a respective slave memory core and a second timing control circuit; wherein said logic control circuit is capable of controlling said master memory core and said slave memory core.

9. The control scheme of claim 8, wherein said first timing control circuit generates a pulse for said second timing control circuit, and a self-timing is self-generated by said second timing control circuit.

10. The control scheme of claim 7, wherein said master chip layer further comprises an input/output buffer, and wherein each of said at least one slave chip layer further comprises a core test logic circuit.

11. The control scheme of claim 7, wherein said first timer and said second timer are a first local timer and a second local timer, respectively.

12. The control scheme of claim 5, wherein said header circuit and said footer circuit comprise at least one NMOS transistor and at least one PMOS transistor, respectively.

13. The control scheme of claim 5, wherein said leakage current tracking circuit comprises a series tracking circuit units.

14. The control scheme of claim 5, wherein said data retention circuit comprises a series pull up transistors.

15. The control scheme of claim 5, wherein said leakage current tracking circuit is capable of clamping to a relative high potential level of a memory array.

16. The control scheme of claim 5, wherein said data retention circuit is capable of clamping to a relative high potential level of a memory array.

* * * * *